United States Patent
Karttunen et al.

(10) Patent No.: US 6,638,448 B2
(45) Date of Patent: Oct. 28, 2003

(54) ELECTRICALLY CONDUCTIVE THERMOPLASTIC ELASTOMER AND PRODUCT MADE THEREOF

(75) Inventors: Mikko Karttunen, Tampere (FI); Jenni Mustonen, Tampere (FI)

(73) Assignee: Premix Oy, Rajamaki (FI)

( * ) Notice: Subject to any disclaimer, the term of this patent is extended or adjusted under 35 U.S.C. 154(b) by 116 days.

(21) Appl. No.: 09/944,408

(22) Filed: Sep. 4, 2001

(65) Prior Publication Data

US 2002/0043654 A1 Apr. 18, 2002

Related U.S. Application Data

(63) Continuation of application No. PCT/FI00/00173, filed on Mar. 3, 2000.

(30) Foreign Application Priority Data

Mar. 4, 1999 (FI) .................................................. 990473
Jun. 15, 1999 (FI) .................................................. 991372

(51) Int. Cl.[7] .............................. H01B 1/22; G21F 7/00
(52) U.S. Cl. ........................ 252/512; 252/514; 264/104; 250/515.1
(58) Field of Search ................................ 252/512, 514; 264/104; 250/515.1

(56) References Cited

U.S. PATENT DOCUMENTS

| | | | |
|---|---|---|---|
| 4,321,162 A | | 3/1982 | Guffens et al. |
| 4,545,926 A | * | 10/1985 | Fouts, Jr. et al. ............ 252/511 |
| 4,701,279 A | * | 10/1987 | Kawaguchi et al. ........ 252/511 |
| 5,736,603 A | | 4/1998 | Pfeiffer et al. |
| 5,837,164 A | | 11/1998 | Zhao |
| 5,993,698 A | * | 11/1999 | Frentzel et al. ............. 252/511 |

FOREIGN PATENT DOCUMENTS

| | | |
|---|---|---|
| EP | 0 103 695 | 3/1984 |
| EP | 0 366 180 A1 | 5/1990 |
| EP | 0 396 957 A3 | 11/1990 |
| EP | 0 942 436 A1 | 9/1999 |
| JP | 5081924 | 2/1993 |
| WO | 95/00327 | 1/1995 |
| WO | 98/20719 | 5/1998 |

\* cited by examiner

Primary Examiner—Mark Kopec
(74) Attorney, Agent, or Firm—Young & Thompson

(57) ABSTRACT

An electrically conductive thermoplastic elastomer and a sealing and/or EMI shielding product comprising a substantially electrically non-conductive matrix material and an electrically conductive filler part which contains metal. The specific resistance of the elastomer is at most 1 Ω.cm.

23 Claims, 3 Drawing Sheets 1  20 % Ag-coated Al-particle, 15 % Ag-coated Cu-flake 2  15 % Ag-coated Al-particle, 15 % Ag-coated glass fibre, 5 % Ag-coated Cu-flake 3  30 % Ag-coated glass fibre, 5 % Ag-coated Al-particle 4  30 % Ag-coated glass fibre, 5 % Ag-coated Al-particle x  matrix SEPS (Kraiburg TP1AAA),
   filler Ag-coated glass fibre y  matrix SEBS (Elastoteknik 500120),
   filler Ag-coated Al-particle z  matrix SEBS (Elastoteknik 500120),
   filler Ag-coated glass fibre

ELECTRICALLY CONDUCTIVE THERMOPLASTIC ELASTOMER AND PRODUCT MADE THEREOF

This application is a Continuation of International Application PCT/FI00/00173 filed Mar. 3, 2000 which designated the U.S. and was published under PCT Article 21(2) in English.

BACKGROUND OF THE INVENTION

The invention relates to an electrically conductive thermoplastic elastomer comprising a substantially electrically non-conductive matrix material and a filler part.

The invention further relates to a sealing and/or an EMI shielding product.

DESCRIPTION OF THE RELATED ART

The continuous increase in electronic equipment has created a need, on one hand, to shield the equipment from electromagnetic interference caused by other electronic equipment and, on the other hand, to reduce the external interference the equipment itself causes. It is especially important to shield equipment whose operational malfunctions may cause physical injury, such as medical equipment and the control and navigational equipment in aircraft. The term EMI (electromagnetic interference) shielding is generally used to refer to the electromagnetic shielding of equipment. The frequency range of the electromagnetic interference in question is typically 100 MHz to 10 GHz.

EMI shielding can be implemented by a casing made of electrically conductive material. The specific resistance of the material should be approximately 1 $\Omega$.cm or less. Several electrically conductive plastic composites have been developed for EMI shielding casings, the composites usually comprising a thermoplastic plastic or plastic compound with one or more conductive fillers, such as metal powder, metal fiber or carbon black. The EMI shielding level of casing composites is sufficient most of the time, but the joints and seams of the casing parts cause problems. A good shielding ability of a casing material does not guarantee a good shielding efficiency, if the sealings or adhesives do not form an electrically conductive cross-link between the different parts of the casing. To solve the sealing problem, various electrically conductive cross-linked and thermosetting elastomers have been developed, in which a substantially electrically non-conductive polymer acting as a matrix material is mixed with metal or metallic particles, carbon, graphite or combinations thereof acting as a conductive filler. It should be mentioned here that the term elastomer refers to a material made of macromolecules, which is characterized by ductility and quick recovery to original shape after the tension is released. In sealing applications, the hardness of the elastomer should preferably be less than 65 Shore A to ensure an easy mounting and appropriate operation. The specific resistance of said prior art electrically conductive elastomers with metal fillers are typically in the range of $10^{-3}$ to $10^{-1}$ $\Omega$.cm and with carbon fillers approximately 0.5 $\Omega$.cm or more. As stated above, the prior art electrically conductive elastomers are based on cross-linked, for instance silicone-based, matrix materials which require cross-linking to obtain elastic properties and to enable product processability. Cross-linking requires a lot of energy and time as well as specific cross-linking means, which makes manufacture of products slow and costly.

Prior art also includes electrically conductive thermoplastic elastomers mixed with carbon black as the electrically conductive filler. The specific resistance of these materials is, however, considerably higher than that of materials based on cross-linked elastomers. It should be noted that in this application, the abbreviation TPE is used for electrically conductive thermoplastic elastomers. Publication U.S. Pat. No. 4,321,162, for instance, discloses a TPE comprising an ethylene-copolymer-propylene polymer compound with carbon black. The specific resistance stated for the material is at its lowest $10^4$ $\Omega$.cm which is not low enough for EMI applications. The specific resistance can be lowered somewhat by increasing the proportion of carbon black in the material, but then the workability and end-use properties deteriorate substantially.

Publication U.S. Pat. No. 5,736,603 discloses an electrically conductive composite material in which a thermoplastic elastomer is impregnated with electrically conductive fibers. The reported volumetric specific resistance is at its lowest approximately $10^6$ $\Omega$.cm which is not enough for EMI shielding. The length of fibers is approximately 10 mm, which means that small-scale products with electrical properties substantially similar in various directions of the product cannot be manufactured of the material. In addition, the manufacturing process of the material comprises several phases making it costly.

SUMMARY OF THE INVENTION

It is an object of this invention to provide an improved thermoplastic electrically conductive elastomer and a sealing and/or EMI shielding product.

The thermoplastic electrically conductive elastomer of the invention is characterized in that the molecule-level structure and/or additives of the elastomer is such that the elastomer can be injection-molded and/or extruded and that the filler contains metal whose proportion is so high that the specific resistance of the electrically conductive thermoplastic elastomer is at most 1 $\Omega$.cm.

The essential idea of the invention is that the TPE is filled with a metal-containing electrically conductive filler so that the specific resistance of the electrically conductive thermoplastic elastomer is at most 1 $\Omega$.cm, preferably at most 0.1 $\Omega$.cm. Further, the idea of the invention is that the electrically conductive TPE can be worked using injection-molding and extrusion methods. The idea of a preferred embodiment is that the viscosity of the TPE matrix material is below the viscosity curve $\eta=43625.7\cdot\gamma^{0.152374-1}$, preferably below $\eta=22197.62\cdot\gamma^{0.120327-1}$, which equations are based on the general presentation format of a viscosity curve $$\eta=K\gamma^{n-1},$$

where $\eta$=viscosity [Pas], $\gamma$=shear rate of the material [$s^{-1}$] and K, n=material-specific constants. The idea of a second preferred embodiment is that the TPE comprises a styrene-ethylene-butylene-styrene copolymer (SEBS) based matrix material to which it is especially easy to mix a filler due to its low viscosity. The idea of a third preferred embodiment is that the TPE comprises a styrene-ethylene-propylene-styrene copolymer (SEPS) based matrix material to which it is also easy to mix a filler due to its low viscosity. The idea of a fourth preferred embodiment is that the filler content is at least 5 volume percent of the entire TPE volume. The idea of a fifth preferred embodiment is that the fill factor of the metal-containing filler is at least 30 volume percent of the entire material volume, which makes it possible to achieve even lower specific resistance values. The idea of a sixth preferred embodiment is that the TPE is filled with at least two electrically conductive fillers with a different particle shape and containing metal, whereby a low TPE specific resistance value can be achieved with a smaller filler content.

The invention provides the advantage that the material provides an excellent EMI shielding efficiency in a finished, for instance injection-molded, product, while retaining the low hardness and other mechanical properties of the TPE at a sufficient level in order to be able to use the material in sealing applications. The manufacturing of the material does not require any special equipment or methods, but only conventional mixing means, for instance a twin-screw extruder or a roll mill, in which the material components are mixed in suitable proportion to each other. The material can be worked in a versatile manner by equipment and methods generally used in plastics industry, such as injection molding, extrusion, thermoforming or any other suitable method. The melt viscosity of the material is sufficiently low to allow the manufacture of high quality products with exacting shapes.

BRIEF DESCRIPTION OF THE DRAWINGS

The invention will be described in greater detail in the attached drawings, in which

FIG. 1 is a schematic illustrating the specific resistance of a few embodiments of an electrically conductive TPE of the invention as a function of the content of various fillers. To be more precise, the figure shows a subsection of the percolation threshold of curves, which threshold occurs with a filler content with which the material changes from an insulating material to an electrically conductive material. In this application, the term filler refers to a filler comprising one or more substances, such as metal particles, composition metal particles, metal-coated organic or inorganic particles or metal particles coated with a conductive polymer. The content unit is a volume percent calculated from the entire TPE volume. It should be noted in this context that unless otherwise stated, the percentages given later in this application are volume fractions calculated from the entire TPE volume. The TPE matrix material is SEPS-based and the filler is either silver-coated aluminium particles, silver-coated glass balls, silver-coated copper flakes, silver-coated glass fiber or nickel-coated graphite. The filler content is 10 to 50%. The TPE was formed and the specific resistance measured as follows:

EXAMPLE 1

A SEPS-based matrix material (trade name Kraiburg TP1AAA) was melted in a Brabender Plasticorder mixer at a rotation speed of 70 min$^{-1}$ at a temperature of 160° C. The highest calculatory shear rate at the used rotation speed is approximately 120 s$^{-1}$. The behaviour of the matrix material viscosity can be presented in the following format:

$$\eta = 147.7405 \cdot \gamma^{0.671878-1}.$$

It should be noted that all viscosity values provided in this application are apparent viscosity values which have been measured with a capillary rheometer at a temperature of 160° C. and at an apparent shear rate range of 20 to 6000 s$^{-1}$. The filler was slowly added to the melted matrix material. After all filler had been added to the matrix material, the torque curve of the mixer was allowed to even out, after which the mixing was continued for 4 to 6 minutes. Test pieces of 3×6 cm in size and 2 mm in thickness were made by compression molding from the mixed TPE stock to determine the specific resistance and hardness.

Figure 1:
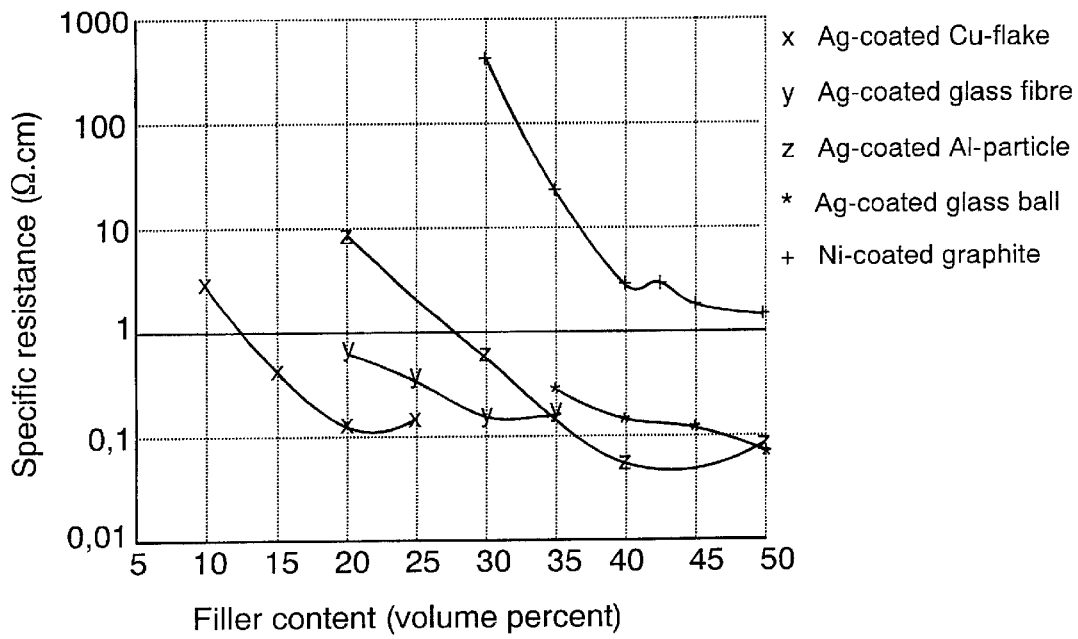
FIG. 1 is a schematic illustrating the specific resistance of a few embodiments of an electrically conductive TPE of the invention as a function of the filler content.

The specific resistance shown in FIG. 1 was measured from the test pieces by placing the test piece between two electrical electrodes and placing the system under a weight of 5000 g. The material-specific specific resistance was calculated from the resistance R value provided by a measuring instrument connected to the electrodes as follows:

$$\sigma = (A \cdot R)/z,$$

where σ=specific resistance [Ω.cm], A=total contact area [cm$^2$] of the electrode and test piece, z=thickness of the test piece [cm], and R=the resistance caused by the piece [Ω].

FIG. 1 shows that with silver-plated fillers the specific resistance of the TPE in the example can be lowered so that it fulfils the specific resistance requirement set for EMI shielding materials, i.e. at most approximately 1 Ω.cm. When the filler is silver-coated copper flakes, said limit is undershot when the filler content is approximately 12%, which corresponds to approximately 59 percent in weight; for silver-coated glass fiber, the limit is below 20%, which corresponds to approximately 57 percent in weight, for silver-coated aluminium particles approximately 28%, which corresponds to approximately 59 percent in weight, and for silver-coated glass balls below 35%, which corresponds to approximately 63 percent in weight. However, by using nickel-coated graphite as the filler, the specific resistance value of 1 Ω.cm cannot be undershot even with a fill factor of 50%, which corresponds to approximately 84 percent in weight, but it can also be used to reduce the TPE specific resistance close to the minimum value set for EMI shielding materials. At its lowest, the value of the specific resistance is approximately 0.05 Ω.cm, which value can be reached with silver-coated aluminium particles at a filler content of approximately 40%. By increasing the compression load, specific resistance values of even a decade lower than this are reached, i.e. approximately 0.005 Ω.cm. By reducing the particle size of the electrically conductive filler to nanoparticle level, it is possible to reach specific resistance values of less than 1 Ω.cm at a less than 10% filler content, or correspondingly, by using nanoparticles, it is possible to reduce the TPE specific resistance value even to 10$^{-4}$ Ω.cm. The TPEs of the example can effortlessly be provided by conventional means known per se, such as with a closed mixing apparatus or a twin-screw extruder. Processing TPE into a product can also be done by methods and means known per se, for instance by injection molding, without requiring any special apparatuses or extra work phases.

Figure 2:
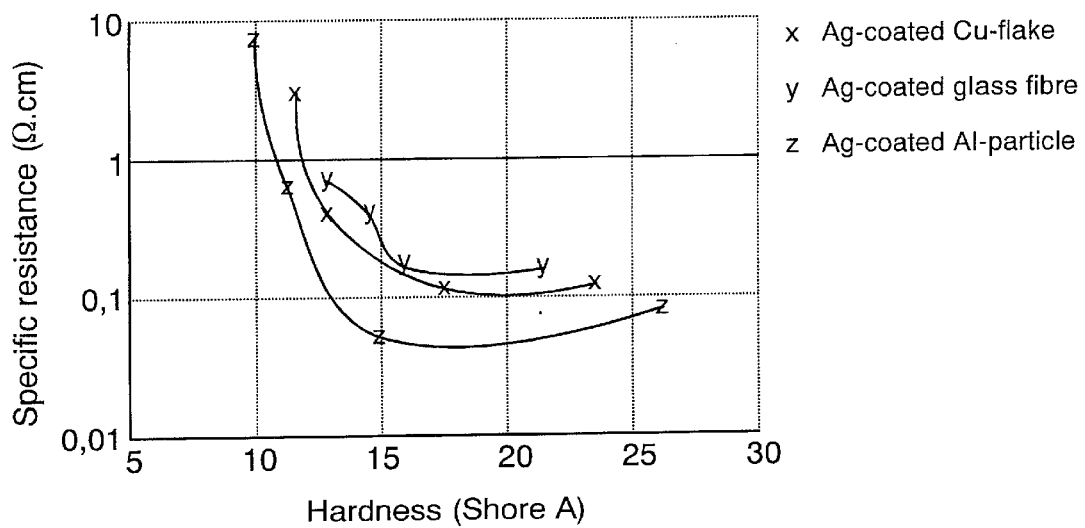
FIG. 2 is a schematic illustrating the specific resistance of the embodiments of the electrically conductive TPE shown in FIG. 1 as a function of hardness.

FIG. 2 is a schematic illustrating the specific resistance of some embodiments of the electrically conductive TPE shown in FIG. 1 as a function of hardness. The electrically conductive filler is silver-coated aluminium particles, silver-coated copper flakes or silver-coated glass fiber. The TPE properties were determined as follows:

EXAMPLE 2

The TPE was formed of a matrix material and a filler, and test pieces were manufactured as described in example 1. The specific resistance of the TPE was determined as in example 1. The material hardness described in FIG. 2 was determined according to standards ASTM D2240 and DIN 53505 with a durometer type A.

As seen in FIG. 2, the hardness of the TPE of the invention using all fillers and filler contents measured in the example is in the range of 10 to 25 Shore A, which makes additional filling of the TPE possible using fire retardants or other application-specific additives, for instance, so that the material hardness remains at the level required of sealing materials. It should be noted that one TPE of the invention, injection-molded into a sealing, has reached an approximately 40 dB attenuation at the frequency range of 20 to 700 MHz. The specific resistance value measured in a corresponding TPE material is approximately 0.1 Ω.cm. In other words, the TPE of the invention is very soft and, as such, well suited for a sealing material or for other corresponding applications.

Figure 3:
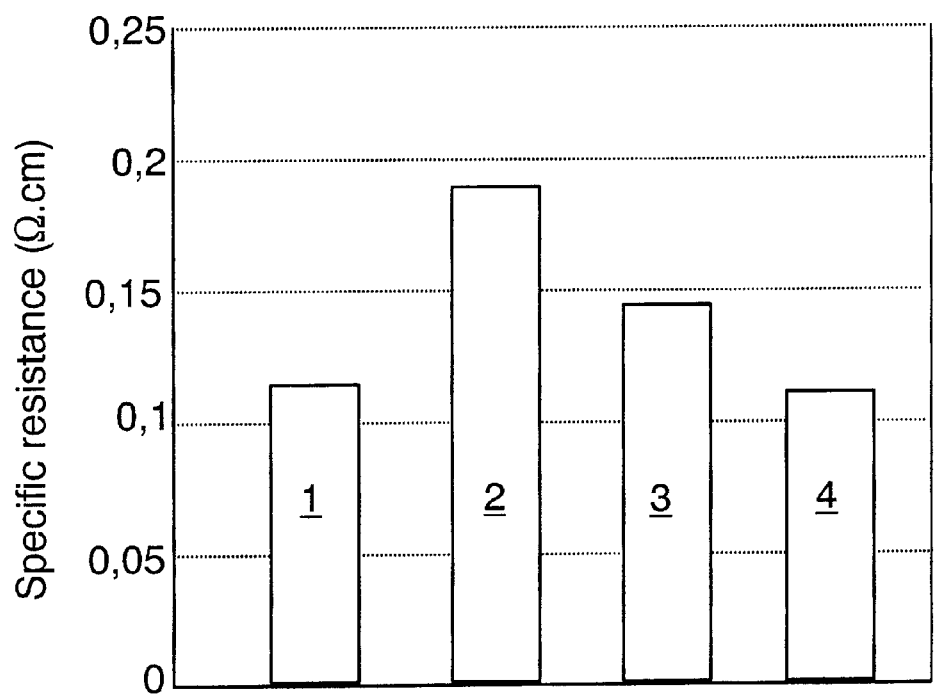
FIG. 3 is a schematic illustrating the specific resistance of some other embodiments of an electrically conductive TPE of the invention.

FIG. 3 is a schematic illustrating the specific resistance of some other embodiments of an electrically conductive TPE of the invention. The TPE matrix material is still a SEPS-based one and the filler comprises one or more particle shapes. Particle shape refers here to a basic shape of a particle, which concept is known per se to a person skilled in the art, and which basic shape can substantially be a ball, cube, block, flake or fiber. The total fill factor of the filler is 35%. The TPE was formed and the specific resistance determined as follows:

EXAMPLE 3

A SEPS-based matrix material (trade name Kraiburg TP1AAA) was melted in a mixer at an increased temperature in the same conditions as in example 1. Fillers were added one after the other and as quickly as possible to the melted matrix material, the fillers being:

Embodiment 1

20% silver-coated aluminium particles and 15% silver-coated copper flakes,

Embodiment 2

15% silver-coated aluminium particles, 15% silver-coated glass fiber and 5% silver-coated copper flakes,

Embodiment 3

30% silver-coated glass fiber and 5% silver-coated aluminium particles, and

Embodiment 4

30% silver-coated glass fiber and 5% silver-coated copper flakes.

After all the filler had been added to the matrix material, the torque curve of the mixer was allowed to even out, after which the mixing was continued for 4 to 6 minutes. Test pieces were made by compression molding from the mixed TPE stock for the purpose of determining the specific resistance, the determining being performed in the manner described in example 1. The determined specific resistance values are shown in FIG. 3.

The specific resistance of each TPE embodiment of the invention prepared in example 3 is at the level required by EMI shielding, i.e. below 1 Ω.cm. The content of the electrically conductive filler can effortlessly be increased from the 35% of the example, which produces even lower specific resistance values, as can be seen in FIG. 1, for instance.

Figure 4:
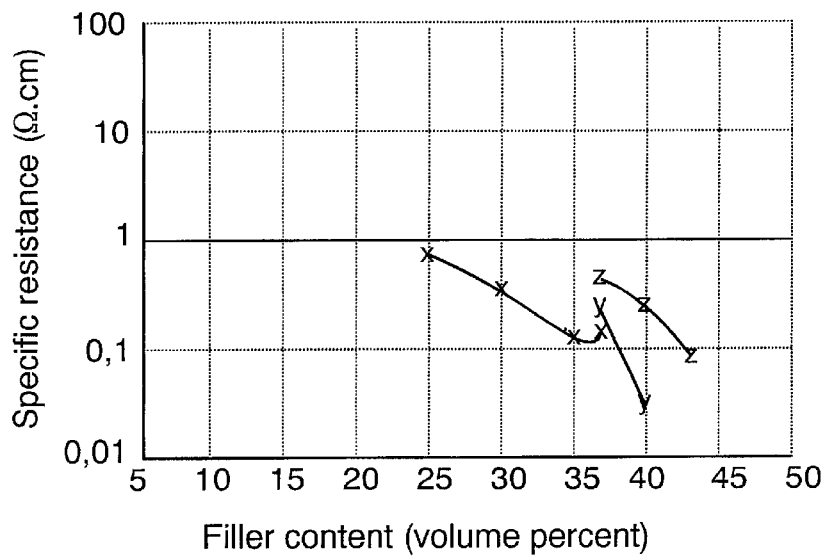
FIG. 4 is a schematic illustrating the specific resistance of further embodiments of an electrically conductive TPE of the invention as a function of the filler content.

FIG. 4 is a schematic illustrating the specific resistance of further embodiments of electrically conductive TPE of the invention as a function of the filler content. The TPE matrix material is a SEPS- or SEBS-based and electrically conductive filler, either silver-coated glass fiber with a 25, 30, 35, 37 or 43% content or silver-coated aluminium particles with a 37 or 40% content. The TPE was formed as follows:

EXAMPLE 4

A matrix material (SEPS-based Kraiburg TP1AAA or SEBS-based Elastoteknik 500120) and a filler were compounded in a twin-screw extruder at a screw rate of approximately 108 min$^{-1}$ and with the set temperatures of the extruder zones being with TP1AAA in zone 1 at 60° C., in zone 2 at 150° C., and in zones 3 to 10 at 160° C.; and with 500120, the temperatures being the same with the exception of zones 3 to 10, whose temperature was set at 180° C. The behaviour of the viscosity of the TP1AAA matrix material can be presented in the following format:

$$\eta = 147.7405 \cdot \gamma^{0.671878} - 1$$

and that of the 500120 material in the format:

$$\eta = 3173.134 \cdot \gamma^{0.380459} - 1.$$

Test pieces were made of the compounded materials by compression molding, and the specific resistance values were measured as described in example 1.

FIG. 4 shows that each TPE of the invention compounded in example 4 undershoots the specific resistance value 1 Ω.cm. The lowest specific resistance value of approximately 0.03 Ω.cm is reached with the 500120 matrix and silver-coated aluminium particles with a content of 40%.

In addition to SEPS or SEBS, the matrix material of the TPE of the invention can comprise one or more polymer components which form a compound of separate phases, i.e. an IPN (Interpenetrating Polymer Networks) structure in which an electrically conductive filler is preferably associated with a continuous phase formed by one component. One IPN material of the invention was formed as follows:

EXAMPLE 5

A SEPS-based material (Kraiburg TP1AAA) and a copolyamide (TRL Themelt 830) were melted and mixed as a matrix material in ratio 65:35 in a mixer at a rotation speed of 70 min$^{-1}$ at a temperature of 160° C., the mixing time being 10 to 15 min. Nanoparticles comprising silver were added to the matrix material as an electrically conductive filler so that the filler content became 26%. The compound of the matrix material and filler was further mixed for 15 to 20 min. Test pieces were made of the materials by compression molding and the specific resistance values were measured as described in example 1.

Values in the range of 10$^{-4}$ Ω.cm were obtained in the specific resistance measurements, i.e. values which excellently fulfil the specific resistance values set on EMI shielding materials.

Figure 5:
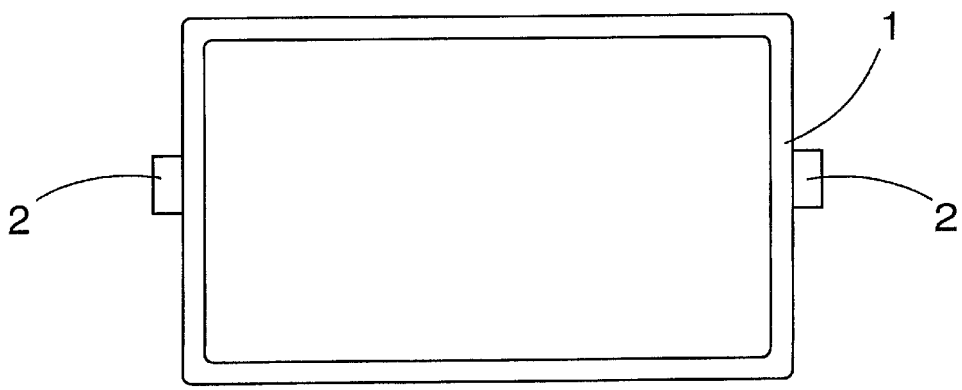
FIG. 5 is a schematic illustrating in a very simplified manner an embodiment of a sealing product of the invention.

FIG. 5 is a schematic illustrating in a very simplified manner an embodiment of a sealing product of the invention.

Sealing 1, whose material is one of the above TPEs, is in cross-section a round band, for instance, or a band of any other shape shaped according to its application, the band forming a substantially rectangular sealing 1. The sealing can be used to seal and EMI shield display terminals or other corresponding casings. A fastening element 2 with which the sealing can be fastened to the object it is applied to, is arranged to the sealing. The fastening element 2 can be of metal, a polymer-based material or any other suitable material. Naturally, other structures or elements can also be arranged or integrated to the sealing in accordance with the requirements of the object it is applied to. The products of the invention can naturally have various shapes and structures.

The drawings and the related description is for the purpose of illustrating the idea of the invention only. The invention may vary in detail within the scope of the claims. Thus, the TPE matrix material can be a compound comprising two or more polymers. The TPE may also comprise other electrically conductive fillers than mentioned above as well as other fillers, accessory agents, additives and reinforcements known per se to a person skilled in the art. The TPE can, if necessary, be cross-linked by exposure to radiation, for instance, in which case the highest allowed usage temperature can be raised. Other products than sealings can be manufactured of the TPE of the invention, such as adhesives, coatings and electrical sensors.

What is claimed is:

1. An electrically conductive thermoplastic elastomer comprising:
   an electrically non-conductive matrix material;
   a filler part, comprising metal-coated particles whose proportion is so high that the specific resistance of the electrically conductive thermoplastic elastomer is at most 1 Ω.cm;
   wherein the molecule-level structure and/or additives of the elastomer is such that the elastomer can be injection-moulded and/or extruded, and
   the molecule-level structure and/or additives of the matrix material is such that the viscosity of the matrix material is below the viscosity curve $\eta=43625.7 \cdot \gamma^{0.52374-1}$, where θ=apparent viscosity and [Pas] γ=apparent shear rate [s$^{-1}$].

2. An electrically conductive thermoplastic elastomer as claimed in claim 1, wherein the metal-coated particles are metal-coated metal particles.

3. An electrically conductive thermoplastic elastomer as claimed in claim 1, wherein the specific resistance of the elastomer is at most 0.01 Ω.cm.

4. An electrically conductive thermoplastic elastomer as claimed in claim 1, wherein the molecule-level structure and/or additives of the matrix material is such that the viscosity of the matrix material is below the viscosity curve $\eta=22197.62 \cdot \gamma^{0.120327-1}$.

5. An electrically conductive thermoplastic elastomer as claimed in claim 1, wherein the matrix material comprises styrene-ethylene-butylene-styrene copolymer.

6. An electrically conductive thermoplastic elastomer as claimed in claim 1, wherein the matrix material comprises mainly styrene-ethylene-butylene-styrene copolymer.

7. An electrically conductive thermoplastic elastomer as claimed in claim 1, wherein the matrix material comprises polymer unmixed with the styrene-ethylene-butylene styrene copolymer.

8. An electrically conductive thermoplastic elastomer as claimed in claim 1, wherein the matrix material comprises styrene-ethylene-propylene-styrene copolymer.

9. An electrically conductive thermoplastic elastomer as claimed in claim 8, wherein the matrix material comprises mainly styrene-ethylene-propylene-styrene copolymer.

10. An electrically conductive thermoplastic elastomer as claimed in claim 8, wherein the matrix material comprises polymer unmixed with the styrene-ethylene-propylene-styrene copolymer.

11. An electrically conductive thermoplastic elastomer as claimed in claim 1, wherein the fill factor of the filler is at least 5% of the entire elastomer volume.

12. An electrically conductive thermoplastic elastomer as claimed in claim 1, wherein the molecule-level structure of the elastomer and the filler content, size and shape are such that the hardness of the elastomer is below 65 Shore A.

13. An electrically conductive thermoplastic elastomer as claimed in claim 12, wherein the molecule-level structure of the elastomer and the filler content, size and shape are such that the hardness of the elastomer is below 50 Shore A.

14. An electrically conductive thermoplastic elastomer as claimed in claim 1, wherein the matrix material is at least partly cross-linked.

15. An electrically conductive thermoplastic elastomer as claimed in claim 1, wherein the fill factor of the filler is at least 30% of the entire elastomer volume.

16. An electrically conductive thermoplastic elastomer as claimed in claim 1, wherein the coating metal comprises silver.

17. An electrically conductive thermoplastic elastomer as claimed in claim 1, wherein the electrically conductive filler comprises nickel.

18. An electrically conductive thermoplastic elastomer as claimed in claim 1, wherein the electrically conductive filler comprises at least two different particle shapes.

19. An electrically conductive thermoplastic elastomer as claimed in claim 1, wherein said electrically conductive thermoplastic elastomer is an isotropically conductive material.

20. A sealing and/or EMI shielding product comprising an electrically conductive thermoplastic elastomer according to claim 1.

21. An electrically conductive thermoplastic elastomer comprising:
   an electrically non-conductive matrix material;
   a filler part, comprising metal-coated particles whose proportion is so high that the specific resistance of the electrically conductive thermoplastic elastomer is at most 0.1 Ω.cm;
   wherein the molecule-level structure and/or additives of the elastomer is such that the elastomer can be injection-moulded and/or extruded; and
   wherein the molecule-level structure and/or additives of the matrix material are such that the viscosity of the matrix material is below the viscosity curve $\eta=43625.7 \cdot \gamma^{0.152374-1}$, where η=apparent viscosity and [Pas ] γ=apparent shear rate [s$^{-1}$].

22. An electrically conductive thermoplastic elastomer comprising:
   a substantially electrically non-conductive matrix material, comprising styrene-ethylene-butylene-styrene copolymer;
   a filler part, comprising metal-coated particles whose proportion is so high that the specific resistance of the electrically conductive thermoplastic elastomer is at most 0.1 Ω.cm;
   wherein the molecule-level structure and/or additives of the elastomer is such that the elastomer can be injection-moulded and/or extruded, and the molecule-level structure and/or additives of the matrix material is such that the viscosity of the matrix material is below the viscosity curve $\eta=43625.7 \cdot \gamma^{0.152374-1}$, where $\eta$=apparent viscosity [Pas] and $\gamma$=apparent shear rate [s$^{-1}$].

23. An electrically conductive thermoplastic elastomer comprising:
- a substantially electrically non-conductive matrix material, comprising styrene-ethylene-propylene-styrene copolymer;
- a filler part, comprising metal-coated particles whose proportion is so high that the specific resistance of the electrically conductive thermoplastic elastomer is at most 0.1 Ω.cm;
- wherein the matrix material the molecule-level structure and/or additives of the elastomer is such that the elastomer can be injection-moulded and/or extruded, and
- the molecule-level structure and/or additives of the matrix material is such that the viscosity of the matrix material is below the viscosity curve $\eta=43625.7 \cdot \gamma^{0.152374-1}$, where $\eta$=apparent viscosity [Pas] and $\gamma$=apparent shear rate [s$^{-1}$].

* * * * *

UNITED STATES PATENT AND TRADEMARK OFFICE
CERTIFICATE OF CORRECTION

PATENT NO.     : 6,638,448 B2
DATED          : October 28, 2003
INVENTOR(S)    : Karttunen et al.

It is certified that error appears in the above-identified patent and that said Letters Patent is hereby corrected as shown below:

<u>Column 7,</u>
Line 41, the equation should read as follows:
-- $\eta = 436525.7 \cdot \gamma^{0.152374-1}$ --.

Signed and Sealed this

Tenth Day of August, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,638,448 B2
DATED : October 28, 2003
INVENTOR(S) : Karttunen et al.

It is certified that error appears in the above-identified patent and that said Letters Patent is hereby corrected as shown below:

Column 7,
Line 41, the equation should read as follows:
-- $\eta = 43625.7 \gamma^{0.152374-1}$ --.

This certificate supersedes Certificate of Correction issued August 10, 2004.

Signed and Sealed this

Twenty-eighth Day of September, 2004

JON W. DUDAS
*Director of the United States Patent and Trademark Office*